United States Patent
Forey et al.

(10) Patent No.: US 10,122,368 B2
(45) Date of Patent: *Nov. 6, 2018

(54) COMPACT HIGH SPEED DUTY CYCLE CORRECTOR

(71) Applicant: INPHI CORPORATION, Santa Clara, CA (US)

(72) Inventors: Simon Forey, Northamptonshire (GB); Rajasekhar Nagulapalli, Northampton (GB); Parmanand Mishra, Cupertino, CA (US)

(73) Assignee: INPHI CORPORATION, Santa, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/840,984

(22) Filed: Dec. 13, 2017

(65) Prior Publication Data

US 2018/0183444 A1    Jun. 28, 2018

Related U.S. Application Data

(63) Continuation of application No. 15/389,830, filed on Dec. 23, 2016, now Pat. No. 9,882,570.

(51) Int. Cl.
*H03K 5/156* (2006.01)
*H03L 7/08* (2006.01)
*H04L 27/01* (2006.01)
*H03G 3/20* (2006.01)

(52) U.S. Cl.
CPC ............ *H03L 7/0807* (2013.01); *H03G 3/20* (2013.01); *H03K 5/1565* (2013.01); *H04L 27/01* (2013.01)

(58) Field of Classification Search
CPC ...... H03L 7/0807; H03G 3/20; H03K 5/1565; H04L 27/01
See application file for complete search history.

(56) References Cited

U.S. PATENT DOCUMENTS

| | | | |
|---|---|---|---|
| 7,705,649 B1* | 4/2010 | Yu | H03K 5/1565 327/175 |
| 2004/0017234 A1* | 1/2004 | Tam | G06F 1/08 327/141 |
| 2009/0121763 A1* | 5/2009 | Bossu | H03K 5/1565 327/175 |
| 2011/0090940 A1* | 4/2011 | Wadhwa | H03K 5/1565 375/219 |
| 2011/0291724 A1* | 12/2011 | Jain | H03K 5/1565 327/175 |
| 2016/0226476 A1* | 8/2016 | Choi | H03K 9/08 |
| 2017/0126219 A1* | 5/2017 | Elbadry | H03K 5/1565 |

* cited by examiner

*Primary Examiner* — Syed Haider
(74) *Attorney, Agent, or Firm* — Richard T. Ogawa; Ogawa P.C.

(57) ABSTRACT

Embodiments of the present invention provide techniques for duty cycle correction of clock signals. An input clock signal passes through a pair of output transistors, which provides an output clock signal based on the input clock signal. A duty cycle sensor generates a first correction signal based on the output clock signal. The first correction signal is at least partially opposite of the output clock signal. A duty cycle corrector generates a second correction signal based on the first correction signal. The duty cycle corrector includes two or more transistors for generating the second correction signal. The second correction signal is applied to the output clock signal. There are other embodiments as well.

20 Claims, 8 Drawing Sheets

-- Prior Art --

COMPACT HIGH SPEED DUTY CYCLE CORRECTOR

CROSS-REFERENCES TO RELATED APPLICATIONS

This application is a continuation of U.S. patent application Ser. No. 15/389,830 filed on Dec. 23, 2016. The contents of which are incorporated by reference herein in their entirety.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, duty cycle correction is often needed.

Over the past, there have been many types of communication systems and methods. Unfortunately, they have been inadequate for various applications. More specifically, detecting loss of signal can be challenging. Therefore, improved systems and methods are desired.

BRIEF SUMMARY OF THE INVENTION

The present invention is directed to data communication. More specifically, embodiments of the present invention provide techniques for duty cycle correction of clock signals. An input clock signal passes through a pair of output transistors, which provides an output clock signal based on the input clock signal. A duty cycle sensor generates a first correction signal based on the output clock signal. The first correction signal is at least partially opposite of the output clock signal. A duty cycle corrector generates a second correction signal based on the first correction signal. The duty cycle corrector includes two or more transistors for generating the second correction signal. The second correction signal is applied to the output clock signal. There are other embodiments as well.

According to an embodiment, the present invention provides a duty cycle correction device. The device includes an input terminal for receiving an input clock signal, which is characterized by a first duty cycle and a signal frequency. The device also includes a first transistor comprising a first gate terminal and a first drain terminal. The first gate terminal is coupled to the input terminal. The device further includes a second transistor comprising a second gate terminal and a second drain terminal. The second gate terminal is coupled to the input terminal. The device also includes an output terminal for outputting a corrected clock signal. The output terminal is coupled to the first drain terminal and the second drain terminal. The corrected clock signal is characterized by a second duty cycle, which is closer to 50% than the first duty cycle. The device additionally includes a duty cycle sensor coupled to the output terminal and being configured to generate a first correction signal. The first correction signal is substantially inverted relative to the clock signal. The device also includes a DAC that is configured to generate a control voltage based on a digital control signal. The device includes a duty cycle corrector that is configured to generate a second correction signal using at least the control voltage and the first correction signal. The second correction signal is coupled to the output terminal.

According to another embodiment, the present invention provides a communication system. The system includes a communication channel for receiving data signal. The system also includes a signal processing module that is configured to equalize the data signal. The system additionally includes a clock data recovery (CDR) device that is configured to generate a first clock signal based on the processed data signal. The system further includes a duty cycle correction (DCC) device that is configured to generate a corrected clock signal based on the first clock signal. The DCC device comprises an input terminal for receiving the first clock signal. The DCC device also includes a first pair of transistors that is configured to receive the first clock signal via the input terminal and to output a second clock signal. The DCC device further includes an output node that is coupled to the second clock signal. The DCC device also includes a duty cycle sensor that is configured to generate a first correction signal based on the second clock signal. The DCC device further includes a duty cycle corrector that is configured to generate a second correction signal based on the first correction signal. The duty cycle corrector includes a second pair of transistors. The second correction signal is coupled to the output node.

According to yet another embodiment, the present invention provides a method for correcting clock duty cycles. The method includes receiving an input clock signal that is characterized by a first duty cycle. The method also includes processing the input clock signal using a first pair of transistors. The method further includes providing an output clock signal using the first pair of transistors. The method additionally includes generating a first correction signal by inverting a portion of the output clock signal. The method also includes a fine digital correction by receiving a duty cycle control code. The method also includes converting the duty cycle control code to a control voltage using a DAC device. The method also includes providing a control signal by a second pair of transistors. The method additionally includes generating a second correction signal by a third pair of transistors using the control signal and the first correction signal. The method also includes applying the second correction signal to the output clock signal, which is characterized by a second duty cycle correction method. The second duty cycle correction is used to correct any duty cycle error which hasn't been corrected by the first method.

It is to be appreciated that embodiments of the present invention provide many advantages over conventional techniques. Among other things, by omitting VCO (as used in existing DCC implementations), input capacitance of duty cycle correction devices according to embodiments of the present invention is reduced and minimized. It is to be appreciated that DCC devices according to the present invention are more energy efficient and have small impact on the clock path bandwidth compared to conventional devices.

Embodiments of the present invention can be implemented in conjunction with existing systems and processes. For example, DCC devices according to embodiments of the present invention can be readily incorporated in existing communication devices. Additionally, DCC devices according to the present invention can be manufactured using existing manufacturing equipment and processes. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
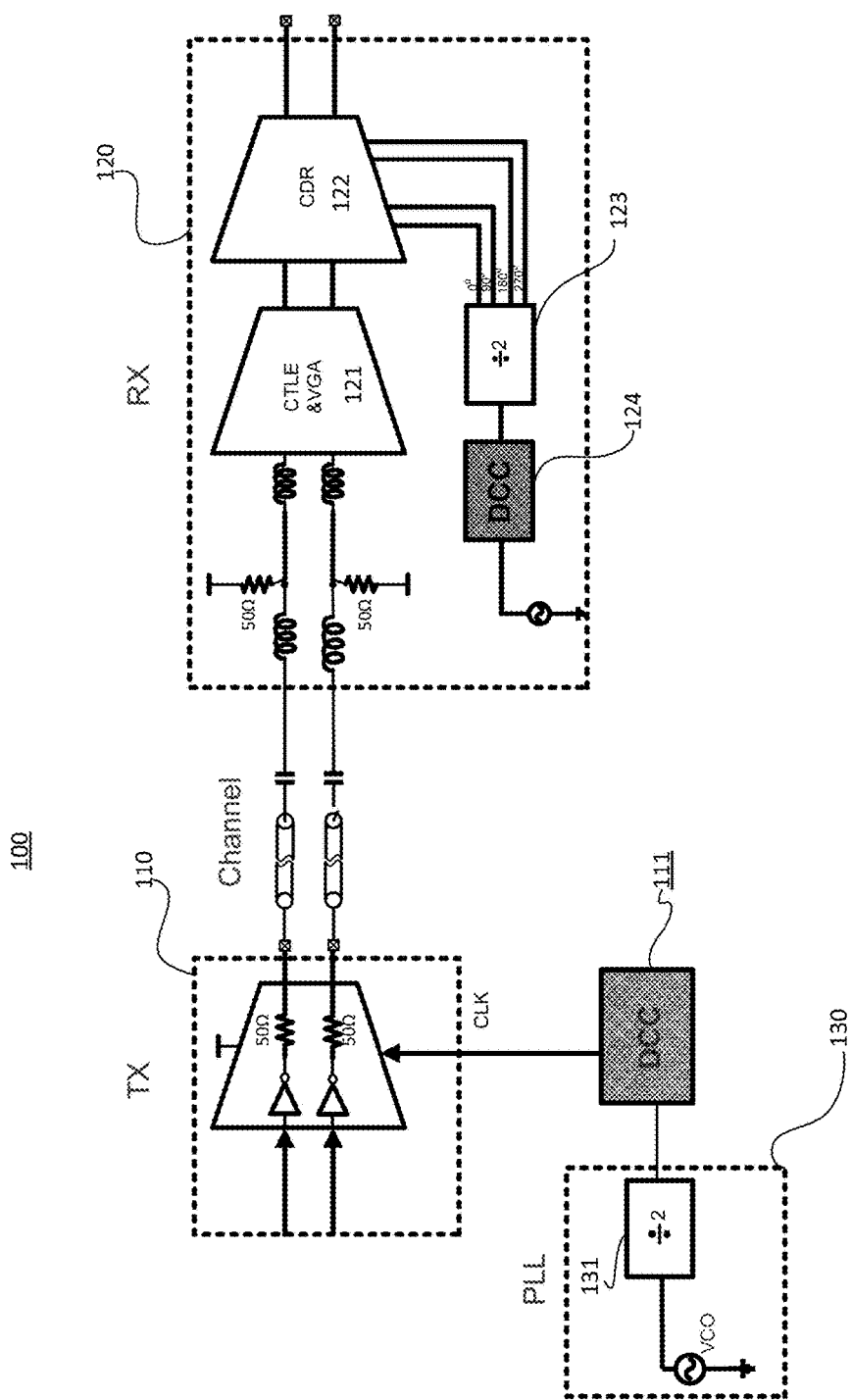
FIG. 1 is a simplified diagram illustrating a communication system according to an embodiment of the present invention.

The present invention is directed to data communication. More specifically, embodiments of the present invention provide techniques for duty cycle correction of clock signals. An input clock signal passes through a pair of output transistors, which provides an output clock signal based on the input clock signal. A duty cycle sensor generates a first correction signal based on the output clock signal. The first correction signal is at least partially opposite of the output clock signal. A duty cycle corrector generates a second correction signal based on the first correction signal. The duty cycle corrector includes two or more transistors for generating the second correction signal. The second correction signal is applied to the output clock signal. There are other embodiments as well.

Clock signals are vital in data communication and various other applications. An important characteristic of clock signals and clocking systems is duty cycle. Often, 50% duty cycle is both important and preferred. For example, half-rate transmitters need 50% duty cycle clock, and departure from this could lead to duty cycle distortion that causes horizontal eye opening at the output. For quarter rate transmitters and receivers, quadrature clocks are needed and typically implemented by using a frequency divider circuits that divides the clock signal by 2, followed by a voltage controlled oscillator (VCO) running at double frequency. If the clock input to the frequency divider is not at 50% duty cycle, the quarter rate transmitter cannot function property due to quadrature error, which in turn leads to degraded link timing margin.

For a duty cycle corrector to satisfy various performance requirements, there are various desirable characteristics. At the input stage, it is desirable to have low input capacitance and lower power consumption, which can typically be achieved by eliminating the voltage controlled oscillator and/or the VCO clock buffer. At the same time, performance of the duty cycle corrector and the clock path bandwidth should be maintained.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a communication system according to an embodiment of the present invention. This diagram is merely an example, which should not unduly limit the scope of the claims. One of ordinary skill in the art would recognize many variations, alternatives, and modifications. As shown in FIG. 1, transmitter 110 is coupled to receiver 120 via a pair of communication channels. For example, the communication channels may be serial communication link, optical communication channel, and/or others. In various embodiments, transmitter 110 performs signal modulation to generate analog signal for transmission over a high-speed communication network (e.g., communication channels as shown). For example, communication signals transmitted from transmitter 110 to receiver 120 are transmitted in pairs (i.e., a positive signal and a negative signal as a differential pair). Once incoming signals are received, receiver 120 processes the received signals accordingly. In certain implementations, receiver 120 includes a pair of input inductors. To process the incoming signal, continuous time linear equalizer (CTLE) and variable gain amplifier (VGA) components are used, which is shown as functional block 121. Depending on the application, CTLE, VGA, and/or other components may be used to adjust the received analog signals for further processing. A clock and data recovery (CDR) module 122 is configured to generate clock signal based on the signal processed by the CTLE/VGA module 121. For example, the CDR module 123 generates clock signal based on the received signal.

In various embodiments, duty-cycle correctors are provided both for the transmitter and the receiver. On the transmitter send, duty-cycle corrector (DCC) 111 is coupled to transmitter 110. Additional, DCC 11 is couple to a phase-lock loop (PLL) 130. PLL 130 includes a divider 131 and a VCO. For example, DCC 111 is implemented to provide clock signal "CLK" as shown for data sampling. Depending on the implementation, such as full-rate architecture, transmitter 110 may not need DCC 111.

DCC 124 of receiver 120 is coupled to the CDR 122. For example, recovered clock signals (at different phases) are coupled to divider 123, and are then processed by DCC 124. The clock signals from the CDR 122 are in four phases (0, 90, 180, and 270), and different types of clock signals can be used as well. As shown in FIG. 1, DCC 124 is coupled to a voltage-controlled oscillator, but it is understood that other configurations are possible as well.

Figure 2:
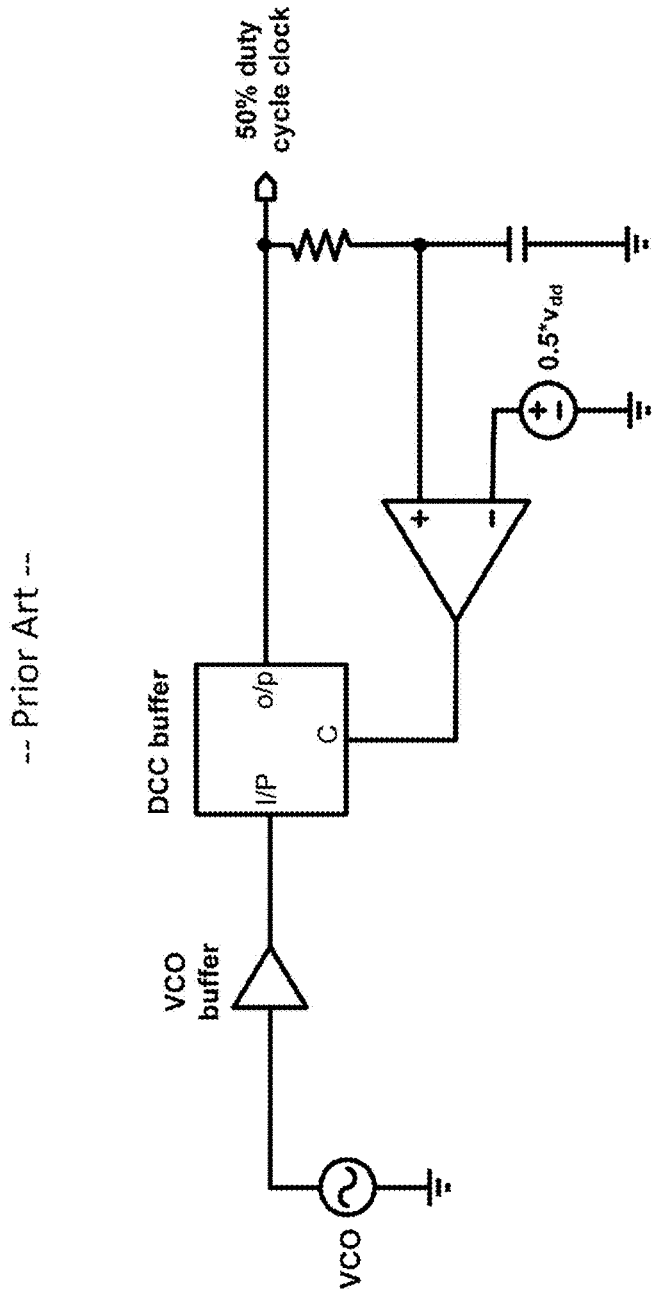
FIG. 2 is a simplified diagram illustrating a conventional DCC implementation.

As mentioned above, conventional duty-cycle corrector implementations have been inadequate. FIG. 2 is a simplified diagram illustrating a conventional DCC implementation. At the input of the DCC buffer, a VCO is coupled to the DCC through a VCO buffer. As mentioned above, the use of VCO introduces capacitance at the input stage, which undesirable for power consumption and potential signal degradation. The output of the DCC buffer is coupled to an operation amplifier via a resistor and a capacitor. It is to be noted that in conventional implementation such as the one shown in FIG. 2, both the resistor and the capacitor are large both in size and value. As a part of the DCC implementation, the resistor and the capacitor effectively provide an RC filter. When operating, the portion of clock signal that is outside of the 50% duty cycle is feed into the DCC buffer, which receives a correction signal from the operation amplifier. The operation amplifier itself is also a relatively large module.

Figure 3:
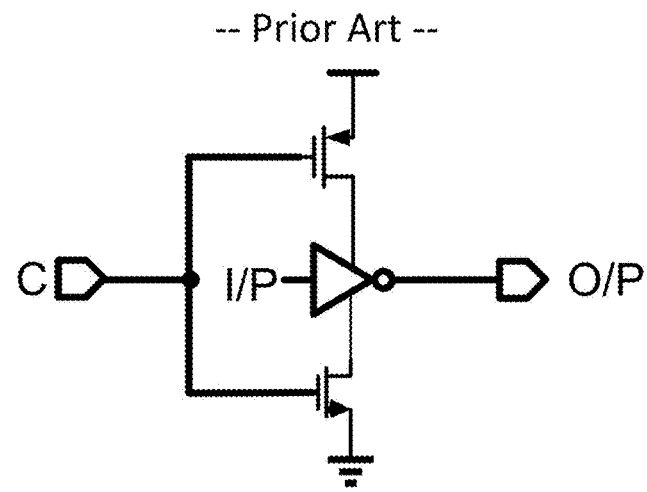
FIG. 3 is a simplified diagram illustrating a conventional DCC buffer with a current starving inverter.

FIG. 3 is a simplified diagram illustrating a conventional DCC buffer with a current starving inverter. Duty cycle correction (i.e., a correction voltage) is applied at node C, as supplied by a PMOS transistor and an NMOS transistor. For example, a high voltage at node C leads to a long duty cycle; a low voltage at node C leads to a short duty cycle. Since both the PMOS transistor and the NMOS transistor are current starving, their operation reduces the speed of the inverter.

Figure 4:
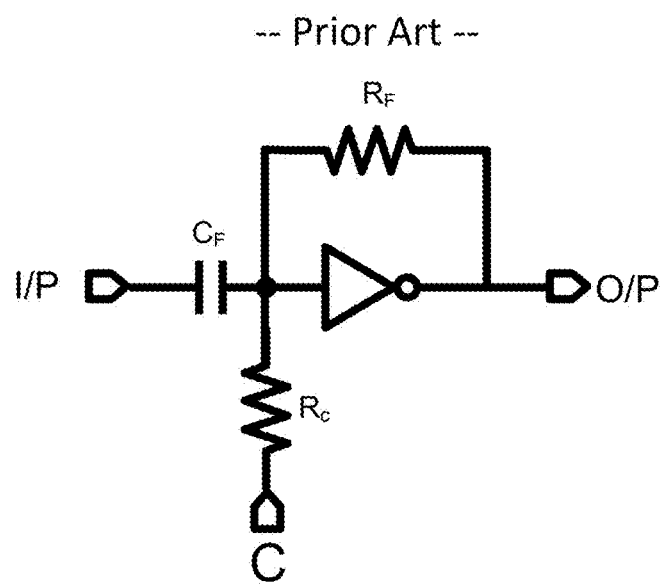
FIG. 4 is a simplified diagram illustrating a conventional DCC buffer with a self-bias inverter.

FIG. 4 is a simplified diagram illustrating a conventional DCC buffer with a self-bias inverter. The input signal is received through capacitor CF, which adds a bottom plate capacitance at the input terminal. For the input, the VCO or the buffer driving self-bias inverter would need to drive the high capacitance attributed to CF. Additionally, the inverter is coupled to resistors $R_F$ and $R_C$. Duty cycles are corrected by applying a correction voltage at node C. To decrease the duration of duty cycle, voltage applied to node C is increased; to increase the duration of duty cycle, voltage applied to node C is decreased.

Figure 5:
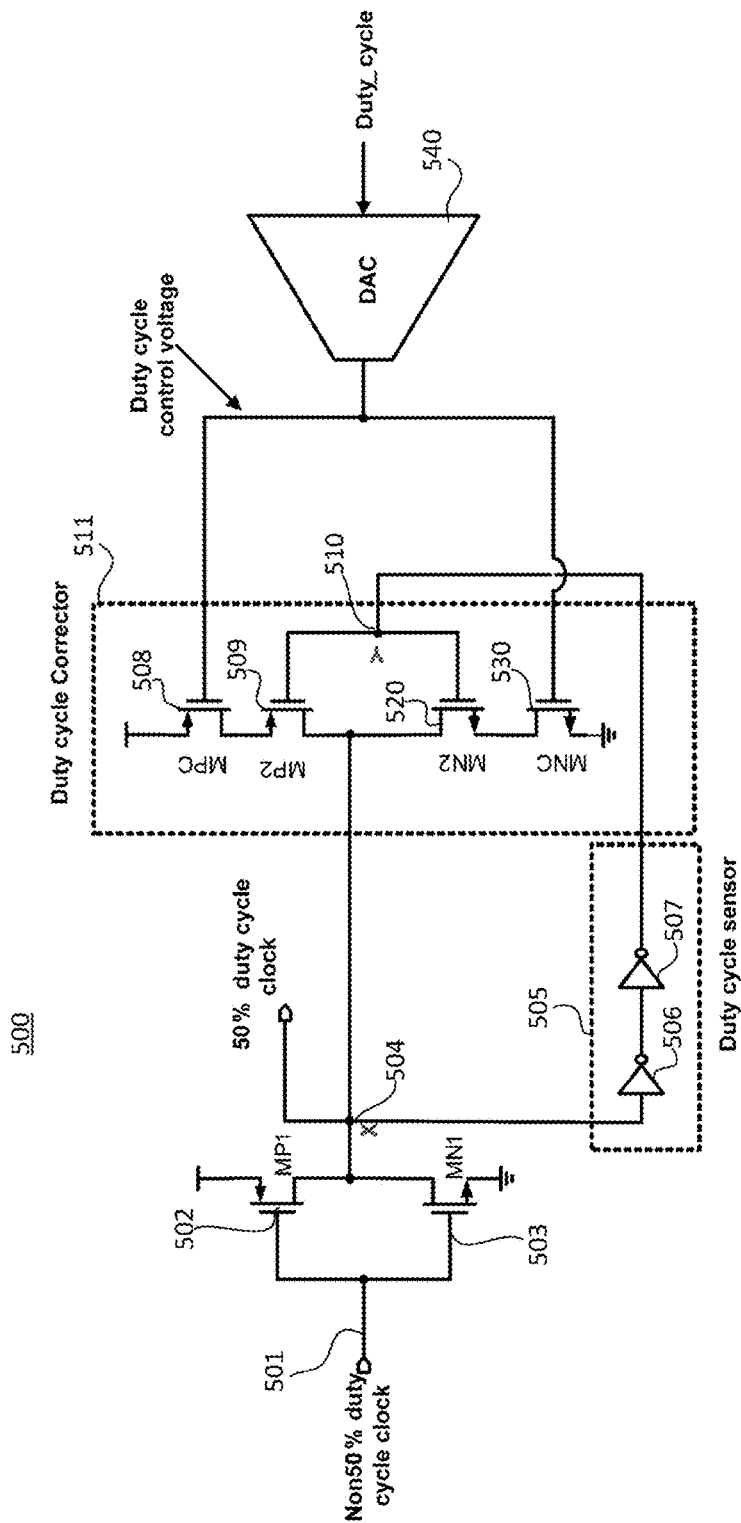
FIG. 5 is a simplified diagram illustrating a duty-cycle correction device 500 according to an embodiment of the present invention.

FIG. 5 is a simplified diagram illustrating a duty-cycle correction device 500 according to an embodiment of the present invention. This diagram is merely an example, which should not unduly limit the scope of the claims. One of ordinary skill in the art would recognize many variations, alternatives, and modifications. As shown in FIG. 5, input clock signal is received at terminal 501. It is to be understood that the input clock signal received at terminal 501 is not at the desired 50% duty cycle, and thus duty cycle is needed, and is performed by the DCC device 500. The input signals are processed by duty cycle sensor 505, and correction signal is generated by the duty cycle corrector and applied to output node X 504 as shown. When the input clock signal is received at terminal 501 and then passes through transistors 502 and 503, duty cycle error (i.e., deviation from the desired 50% duty cycle) is detected by the duty cycle sensor 505 that includes one or more inverters. Duty cycle correction signal is injected by transistor 509 and transistor 520. Relative to transistors 502 and 503, transistors 509 and 520 are much smaller (and "weaker"), and the correction signal that opposes the duty cycle error is provided by transistors 509 and 520.

As can be seen in FIG. 5, there is additional load configured at the input (e.g., coupled to transistors 502 and 503), DCC device 500 imposes no additional load on the circuit (not shown in FIG. 5) that drives the duty cycle correction buffer. Further, DCC device 500 does not include a filter (e.g., RC elements) or operational amplifier, and as a result DCC device 500 can be made very compact.

In various embodiments, transistors 509 and 520 are configured much smaller compared to transistors 502 and 503. For example, transistors 509 and 520 may be an order of magnitude smaller (e.g., 6 times) than transistors 502 and 503. It is to be appreciated that the relative small transistor size (i.e., smaller in size and electrical characteristics) of transistors 509 and 520 reduces and minimizes latching effects of these transistors on the signal.

When input clock signal is received at input terminal 501, the input clock signal is processed coupled to the gate terminals of transistors 502 and 503. More specifically, source terminal of transistor 502 is coupled to a supply voltage, while the drain terminal is coupled to output node X 504. Transistor 502 is implemented using a PMOS transistor. Transistor 503 is implemented using an NMOS transistor. The source terminal of transistor 503 is grounded, and the drain terminal of transistor 503 is coupled to output node X 504.

Output node X 504 is coupled to duty cycle sensor 505, which uses the output clock signal at node X 504 as an input signal. Duty cycle sensor 505 comprises inverters 506 and 507 as shown. For example, "inverted" clock signals provides an opposite waveform that can be used to correct the output clock signal as needed. Depending on the implementation, duty cycle sensor 505 can be implemented in other ways as well.

Correction signal for the output clock signal is generated by duty cycle corrector 511. The output of duty cycle sensor 505 is coupled to node Y 510. Node Y 510 is coupled to the gates of transistors 509 and 520. In various implementations, transistor 509 comprises a PMOS transistor, and transistor 520 comprises an NMOS transistor. Transistors 509 and 520 are much smaller in size compared to transistors 502 and 503, as explained above. Since the input signal to the gates includes inverted output clock signal, the output of transistors 509 and 520 at their respective drain terminals are "opposite" relative to the output clock signal at node X 504, thereby applying a correction to the output clock signal. Additionally, source terminals of transistors 509 and 520 are respectively coupled to transistors 508 and 530. Transistors 508 and 530 provides control signal received from DAC 540. As shown, drain terminal outputs of transistors 508 and 530 are respectively coupled to the source terminals of transistors 509 and 520. Implemented with a PMOS transistor, the source terminal of transistor 508 is coupled to the supply voltage (e.g., VDD). Implemented with an NMOS transistor, the source terminal of transistor 530 is coupled to the ground.

DAC 540 receives duty cycle control signal (i.e., "Duty_cycle") in digital format and generates a duty cycle control voltage is applied to the gate terminals of transistors 508 and 590. In various implementations, duty cycle control signal may be received from an external control module (not shown) that is part of a feedback control loop. For example, a large value of the duty cycle control signal is converted by DAC 540 to a high duty cycle control voltage. A high voltage at the gate terminal of transistor 508 increases the rise time. Additionally, a high voltage at the gate terminal of transistor 530 decreases the fall time. By both increasing rise time and decreasing fall time, a high duty cycle control voltage thus increases the duty cycle. And vice versa. Depending on the implementation, "duty_cycle" signal may be determined using a feedback mechanism. More specifically, based on the duty cycle of the output clock signal, a control module (not shown) generates the "duty_cycle" signal for DAC 540, which in turn generates the duty cycle control voltage.

Figure 6:
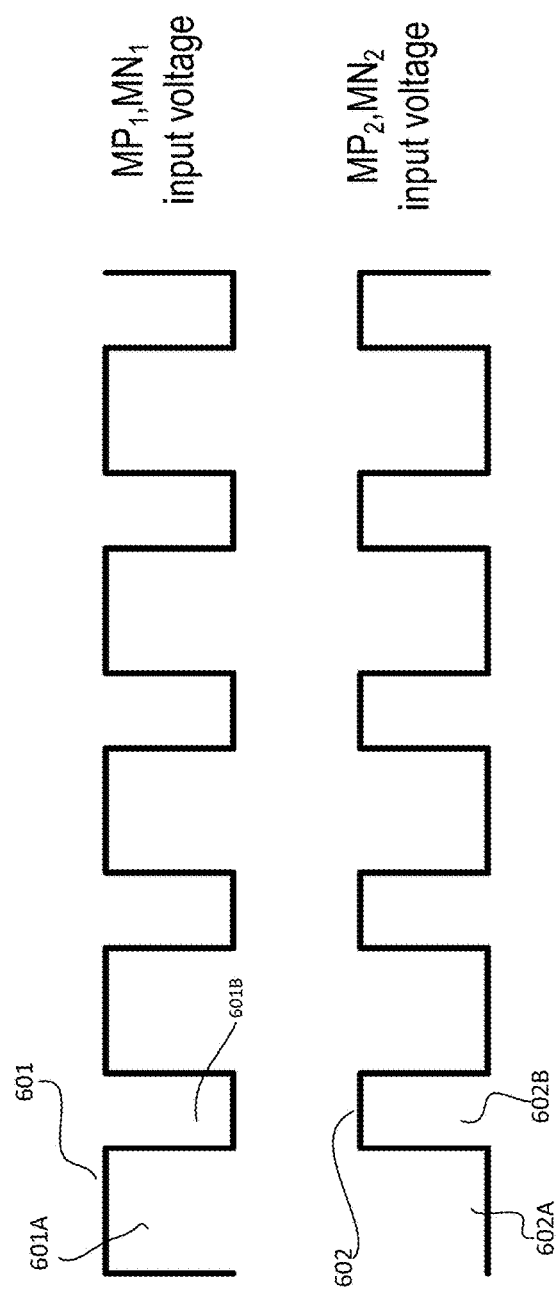
FIG. 6 is a simplified timing diagram illustrating operation of a duty cycle correction device according to embodiments of the present invention.

FIG. 6 is a simplified timing diagram illustrating operation of a duty cycle correction device according to embodiments of the present invention. This diagram is merely an example, which should not unduly limit the scope of the claims. One of ordinary skill in the art would recognize many variations, alternatives, and modifications. For example, waveforms 601 and 602 illustrates operation of duty cycle corrector 500 illustrated in FIG. 5. More specifically, waveform 601 corresponds to the input clock signal voltage at input terminal 501, which is coupled to the gate terminals of transistors 502 and 503. The input clock signal is off from the desired 50% duty cycle. The "high" state of waveform 501 is longer than its "low" state. For example, "high" state at 601A is longer than the "low" state at 601B. To correct waveform 601, an "opposite" voltage at corresponding time is needed. Waveform 602 corresponds to the signal at node Y 510 in FIG. 5. As described above, the voltage at node Y 510 is based on the output of duty cycle sensor 505. Waveform 602 is used as input voltage (applied at the gate terminals) for transistors 509 and 520, which provide a correction signal to the output clock signal at node X 504. Being "opposite" relative to the input clock signal, waveform 602 provides the control voltage (to transistors 509 and 520) for correcting the output clock signal that is based on the input clock signal (waveform 601). For example, the "high" state at 601A of waveform 601 can be corrected by the "low" state at 602A of waveform 602. Similarly, the "low" state 601B of waveform 601 can be corrected by the "high" at 602B of waveform 602. In various embodiments, the "opposite" waveform 602 can be generated by using one or more inverters, but it is to be understood that other implementations are possible as well.

Figure 7:
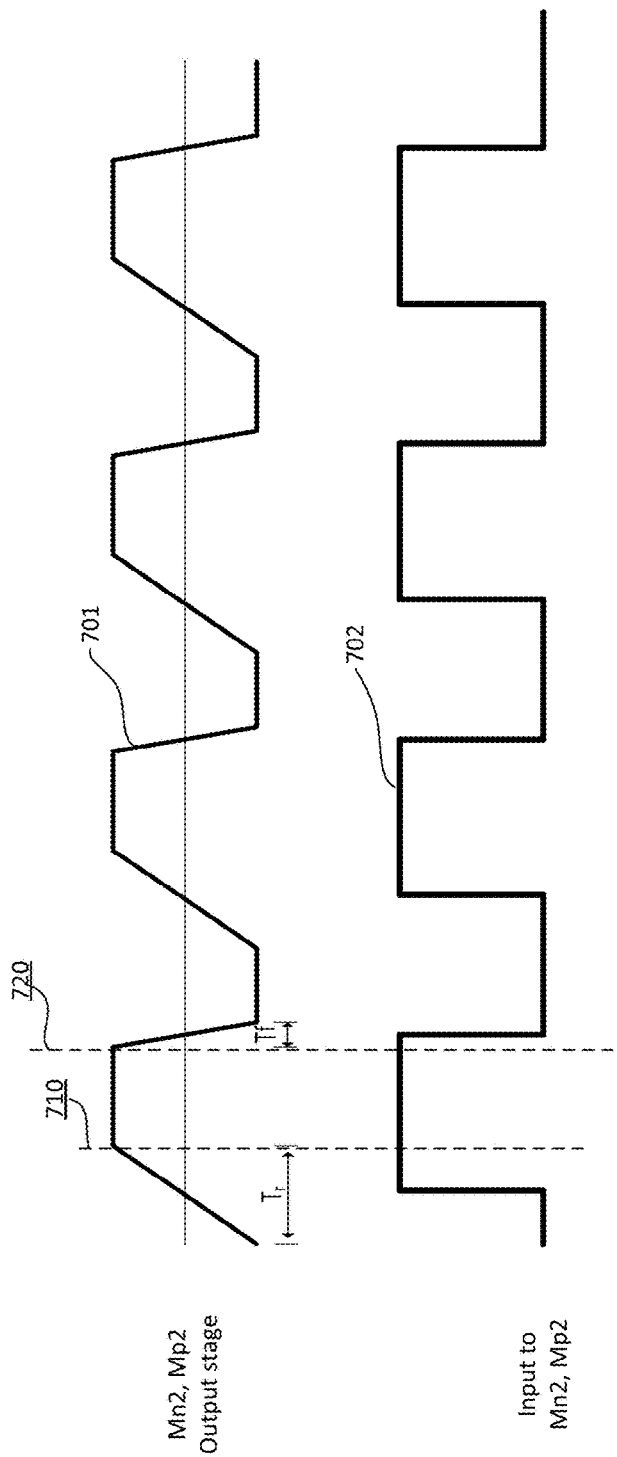
FIG. 7 is a simplified diagram illustrating DAC correction signals according to embodiments of the present invention.

FIG. 7 is a simplified diagram illustrating DAC correction signals according to embodiments of the present invention. This diagram is merely an example, which should not unduly limit the scope of the claims. One of ordinary skill in the art would recognize many variations, alternatives, and modifications. For example, waveforms 701 and 702 illustrate operation of duty cycle corrector 500 illustrated in FIG. 5. More specifically, waveform 701 corresponds to the outputs of transistors 509 and 520. As explained above, a high voltage at the gate terminal of transistor 508 increases the rise time $T_r$ for output of transistor 509. Additionally, a high voltage at the gate terminal of transistor 530 decreases the fall time $T_f$ of output of transistor 520. More specifically, an increase in the DAC 540 output causes an increase in resistance of transistor 508. Also, the increase in the DAC 540 output causes a decrease in resistance of transistor 530. The changes in clock duty cycle are evident by comparing waveforms 701 and 702. Waveform 702 shows the input signal (from the duty cycle sensor 505) that is applied to gate terminals of transistors 508 and 530. By increasing the rise time $T_r$, waveform 701 reaches "high" state at time 710, which is later than the time that waveform 702 reaches its corresponding "high" stage. By decreasing the fall time $T_f$, waveform 701 starts falling from its "high" state at time 720, which is earlier than the time that waveform 702 starts falling from its corresponding "high" state. It is to be appreciated that transistors 509 and 520 are much smaller than transistors 502 and 503, and the relative small size ensures that bandwidth reduction on in the clock path is minimized.

Figure 8:
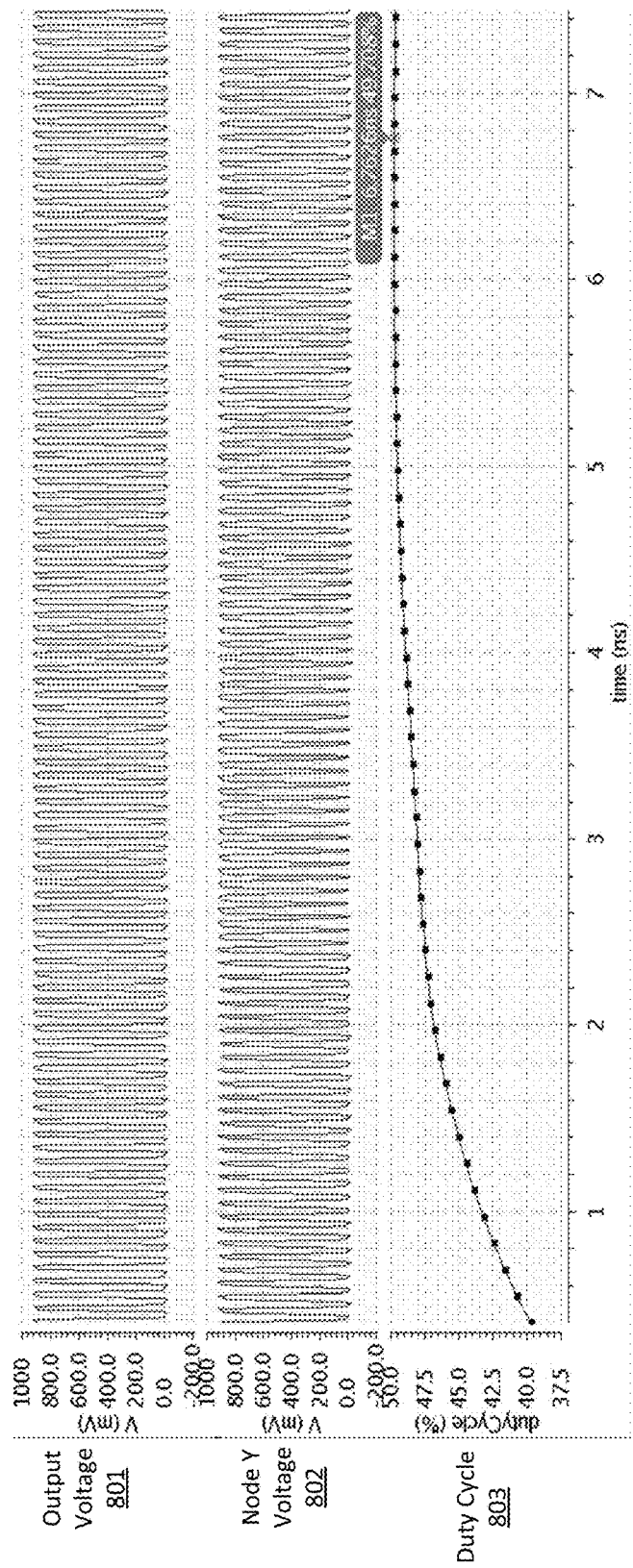
FIG. 8 is a graph illustrating operation of duty cycle correction device 500 according to embodiments of the present invention.

FIG. 8 is a graph illustrating operation of duty cycle correction device 500 according to embodiments of the present invention. This diagram is merely an example, which should not unduly limit the scope of the claims. One of ordinary skill in the art would recognize many variations, alternatives, and modifications. For the purpose of illustration, an input clock signal with a duty cycle of 40% is provided to the input terminal 501 of the duty cycle correction device 500. Transistors 509 and 520 provide correction voltage to the output clock signal at node X 504, and the output waveform is shown on graph 801. Voltage waveform at node Y 510 (as provide by duty cycle sensor 505) is shown on graph 802. For example, voltage waveform at node Y 510 is the output of duty cycle sensor 505, and it is applied to the gate terminals of transistors 509 and 520. Graph 803 shows duty cycle of the output clock signal (i.e., corresponding to the waveform 801 for the output clock signal voltage). The output voltage on graph 803 is corrected by the outputs of transistors 509 and 520. Starting at 40% duty cycle, the output clock signal is at about 43% duty cycle at about 1 ns (about 10 clock cycles later). By 4 ns, the duty cycle for the output clock signal is already at 49%, and at about 7 ns mark, the duty cycle is at about 49.7%, which is very close to the desired 50% duty cycle.

Figure 9:
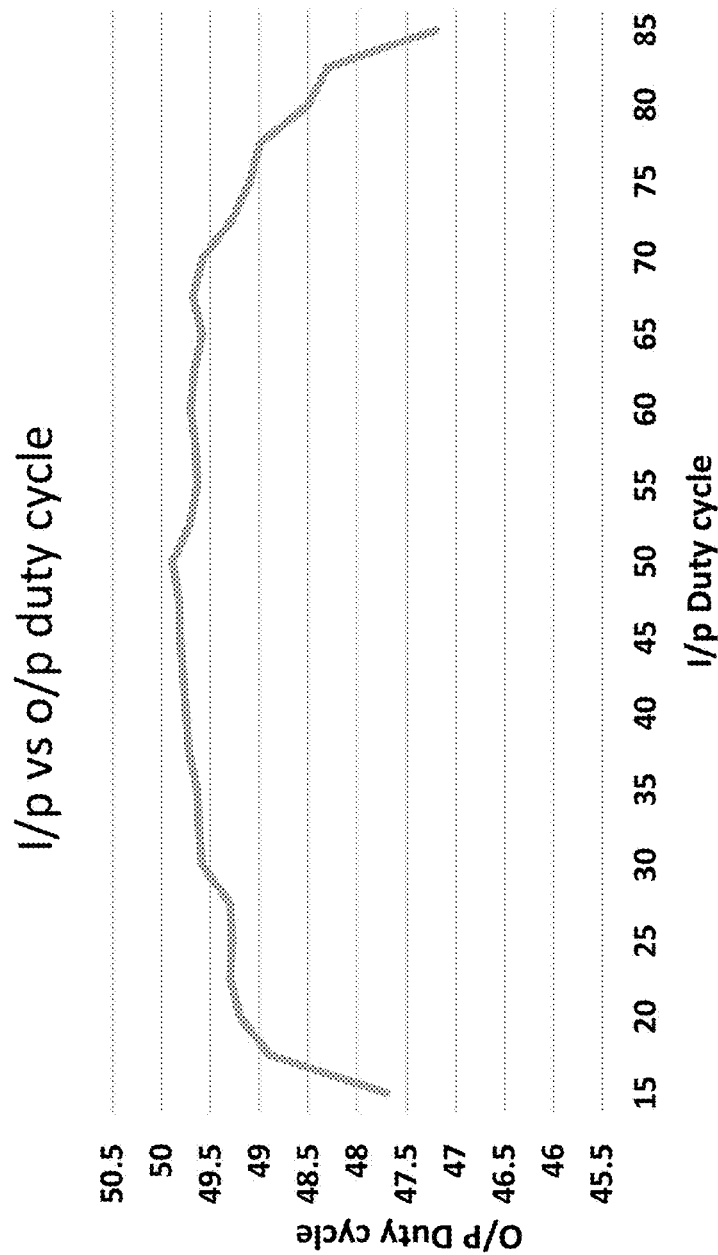
FIG. 9 is a graph illustrating a relationship between output duty cycle and input duty cycle for a duty cycle correction device according to embodiments of the present invention.

FIG. 9 is a graph illustrating a relationship between output duty cycle and input duty cycle for a duty cycle correction device according to embodiments of the present invention. This diagram is merely an example, which should not unduly limit the scope of the claims. One of ordinary skill in the art would recognize many variations, alternatives, and modifications. As shown in FIG. 9, a duty cycle correction device is capable of correct clock signal that is way off. For example, for an input clock with duty cycle of 15%, the DCC device can bring the output clock duty cycle to over 47.5%. For an input clock with duty cycle of 85%, the DCC device can bring the output clock duty cycle to over 47%. For input clock duty cycle between 20% and 70%, the DCC device is capable of bring the output clock duty cycle to over 49%. Depending on the system configuration, a high level of duty cycle accuracy can be achieved.

It is to be appreciated that DCC techniques according to embodiments of the present invention can be implemented in various ways. For example, one or more inverters can be used in conjunction with transistors to generate the correction signal as needed to adjust the output clock signal. Depending on the application, duty cycle waveform and adjustment speed can be specifically implemented.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A duty cycle correction device comprising:
an input terminal for receiving a first clock signal, the first clock signal being characterized by a first duty cycle and a signal frequency;
a first pair of transistors being configured to receive the input clock signal and output a second clock signal;
an output terminal for outputting a corrected clock signal, the output terminal being coupled to the first pair of transistors, the corrected clock signal being characterized by a second duty cycle, the second duty cycle being closer to 50% than the first duty cycle;
a duty cycle sensor coupled to the output terminal and being configured to generate a first correction signal, the first correction signal being substantially inverted relative to the input clock signal;
a digital to analog converter (DAC) being configured to generate a control voltage based on a digital control signal; and
a duty cycle corrector being configured to generate a second correction signal using at least the control voltage and the first correction signal, the second correction signal being coupled to the output terminal.

2. The device of claim 1 wherein the first pair of transistors comprises a PMOS transistor and an NMOS transistor.

3. The device of claim 1 wherein the duty cycle comprises a first inverter and a second inverter.

4. The device of claim 1 wherein the input terminal receives the first clock signal from a clock data recovery device.

5. The device of claim 1 wherein the duty cycle corrector comprises a second pair of transistors.

6. The device of claim 5 wherein the duty cycle corrector further comprises a third pair of transistors.

7. The device of claim 5 wherein the third pair of transistor is associated with a raise time and a fall time of the corrected clock signal.

8. The device of claim 5 wherein where the second pair of transistors is characterized by a smaller area than the first pair of resistors.

9. The device of claim 1 wherein the duty cycle is associated with an operating frequency, the operating frequency being lower than the signal frequency.

10. A communication system comprising:
a signal processing module being configured to equalize a data signal;
a clock data recovery (CDR) device being configured to generate a first clock signal based on the equalized data signal;
a duty cycle correction (DCC) device being configured to generate a corrected clock signal based on the first clock signal, wherein the DCC device comprises:
an input terminal for receiving the first clock signal;
a first pair of transistors being configured to receive the first clock signal via the input terminal and to output a second clock signal, the first pair transistor comprises a PMOS transistor and an NMOS transistor;
an output node being coupled to the second clock signal;
a duty cycle sensor being configured to generate a first correction signal based on the second clock signal; and
a duty cycle corrector being configured to generate a second correction signal based on the first correction signal, the second correction signal being coupled to the output node.

11. The system of claim 10 wherein the signal processing module comprises a continuous time linear equalizer.

12. The system of claim 10 wherein the signal processing module further comprises a variable gain amplifier.

13. The system of claim 10 wherein the CDR device is configured to generate four clock phases.

14. The system of claim 10 wherein the first pair of transistors comprises a PMOS transistor and an NMOS transistor.

15. The system of claim 10 wherein the DCC device further comprises a digital to analog converter (DAC) module for generating a duty cycle control voltage.

16. The system of claim 15 wherein the duty cycle corrector further comprises a second pair of transistors, the second pair of transistors being configured to generate control signals applied to the second pair of transistors.

17. The system of claim 15 wherein the DAC module is configured to convert a duty cycle control signal to the duty cycle control voltage.

18. The system of claim 10 wherein the CDR device is coupled to a divider device.

19. A method for correcting clock duty cycles, the method comprising:
processing an input clock signal using a first pair of transistors, the input clock signal being characterized by a first duty cycle;
providing an output clock signal using the first pair of transistors;
generating a first correction signal by at least inverting a portion of the output clock signal;
receiving a duty cycle control value;
converting the duty cycle control value to a control voltage;
providing a control signal by a second pair of transistors;

generating a second correction signal by a third pair of transistors using the control signal and the first correction signal, the second correction being associated with a rise or fall time; and applying the second correction signal to the output clock signal, the output clock signal being characterized by a second duty cycle, the second duty cycle being closer to 50% than the first duty cycle.

20. The method of claim 19 further comprising determining the duty cycle control value based on the first duty cycle.

* * * * *